(12) United States Patent
Jan et al.

(10) Patent No.: US 7,673,200 B2
(45) Date of Patent: Mar. 2, 2010

(54) REPROGRAMMABLE BUILT-IN-SELF-TEST INTEGRATED CIRCUIT AND TEST METHOD FOR THE SAME

(75) Inventors: Hsun-Yao Jan, Hsinchu (TW); Ting-Han Su, Hsinchu (TW); Cheng-Fang Yang, Hsinchu (TW)

(73) Assignee: Asix Electronics Corporation, Hsinchu (TW)

( * ) Notice: Subject to any disclaimer, the term of this patent is extended or adjusted under 35 U.S.C. 154(b) by 252 days.

(21) Appl. No.: 11/870,242

(22) Filed: Oct. 10, 2007

(65) Prior Publication Data

US 2009/0100305 A1    Apr. 16, 2009

(51) Int. Cl.
*G01R 31/28* (2006.01)
(52) U.S. Cl. ..................... 714/724; 714/733
(58) Field of Classification Search .............. 714/724, 714/718, 733, 734, 30, 31, 725; 365/200, 365/201, 185.33
See application file for complete search history.

(56) References Cited

U.S. PATENT DOCUMENTS

| | | | |
|---|---|---|---|
| 6,000,048 A * | 12/1999 | Krishna et al. | 714/718 |
| 6,230,290 B1 * | 5/2001 | Heidel et al. | 714/718 |
| 6,249,889 B1 | 6/2001 | Rajsuman et al. | |
| 6,671,843 B1 | 12/2003 | Kebichi et al. | |
| 6,829,728 B2 | 12/2004 | Cheng et al. | |
| 6,873,557 B2 | 3/2005 | Chang et al. | |
| 6,910,155 B2 | 6/2005 | Ku | |
| 7,466,160 B2 * | 12/2008 | Ong et al. | 324/765 |
| 7,478,290 B2 * | 1/2009 | Co et al. | 714/718 |
| 2003/0023914 A1 | 1/2003 | Taylor et al. | |

* cited by examiner

*Primary Examiner*—Phung M Chung
(74) *Attorney, Agent, or Firm*—Ming Chow; Sinorica, LLC

(57) ABSTRACT

The present invention discloses a reprogrammable built-in-self-test integrated circuit and a test method for the same, wherein test programs are directly stored in the application program memory of the logic chip of a SoC IC, and an external test apparatus is used to load the test programs into the application program memory via a serial transmission interface, and an application CPU is used to read and execute the test programs to perform the bonding-wire connectivity between the logic chip and the memory chip. In the present invention, test vectors can still be flexibly revised after tape-out to increase test coverage. As the test programs are directly stored in the existing application program memory without using additional memory space, and as the test programs are executed by the existing application CPU without using an extra built-in-self-test circuit, the present invention can effectively reduce test cost.

17 Claims, 2 Drawing Sheets

REPROGRAMMABLE BUILT-IN-SELF-TEST INTEGRATED CIRCUIT AND TEST METHOD FOR THE SAME

BACKGROUND OF THE INVENTION

1. Field of the Invention

The present invention relates to a reprogrammable built-in-self-test integrated circuit and a test method for the same, particularly to a reprogrammable built-in-self-test Multi-Chip-Package System-on-Chip Integrated Circuit (MCP SoC IC) and a method for the same.

2. Description of the Related Art

In an MCP SoC IC, a plurality of chips is packaged together, including a logic chip and a memory chip, which are electrically connected by bonding wires. In other words, a system chip and a memory chip (such as a flash memory, a SRAM (Static Random Access Memory), or a SDRAM (Synchronous Dynamic Random Access Memory)) are usually integrated into an MCP SoC IC. However, the IC package process usually causes open circuit or short circuit of bonding wires.

After package, a final test is often performed to check the bonding-wire connectivity. Below, the existing final tests for bonding-wire connectivity are described.

Firstly, a dedicated BIST circuit is sometimes embedded inside IC to test a memory. The dedicated BIST circuit can automatically generate pre-defined test vectors to execute memory-read and memory-write activities and compares the execution results and then outputs the test result via pins. In such an approach, special test vectors should be designed beforehand according to the arrangement of bonding pads. Once there is any slight change in the arrangement of bonding pads during the layout process, the embedded BIST circuit should be redesigned also. However, the arrangement of bonding pads will not settle until the last stage. Therefore, although test coverage is found to be insufficient, test vectors cannot be changed any more in this approach after the completion of a chip. Besides, the dedicated BIST circuit of this approach cannot apply to memory chips with different memory densities because of its inflexibility. In addition, test failures cannot be further analyzed after a completed chip is tested in this approach.

There is also a test method of directly writing/reading a memory, wherein the address bus, the data bus, and other control signals of a memory are connected to pins on the surface of IC, and a test apparatus generates test signals to perform an access test on the memory inside IC. In this approach, a small-package IC may have insufficient pins to connect with control signals or even need additional multiplexing circuits to switch pins, which will make the I/O design more complicated. Besides, this approach can only test the connectivity between a memory and pins but cannot test the connectivity between the memory and a CPU core.

There is also a test method of using an embedded CPU, wherein a test program is beforehand burned on a special storage space, such as a ROM. The test program is separated from the main program; during a test, the program source is switched to the dedicated storage space for the test program. Alternatively, the test program is incorporated with the main program to form a single program; during a test, the main program is switched to a test mode, and the test is undertaken under the test mode. During the test, the memory-read and memory-write activities are performed, and the test data is compared and analyzed, and then the final result is output. A US pub patent No: US20030023914 A1 exactly adopts this approach. In the test method of using an embedded CPU, the test program is incorporated with the main program or occupies some memory space. However, the IC does not use the test program in normal operations. Thus, the hardware resource of IC is wasted. Besides, the test program is settled before tapeout. After the chip is completed, the test program is unlikely to be revised. Therefore, neither test coverage improvement nor failure analysis & diagnosis is available in this approach.

Accordingly, the present invention proposes a reprogrammable built-in-self-test integrated circuit and a test method for the same to overcome the abovementioned problems.

SUMMARY OF THE INVENTION

The primary objective of the present invention is to provide a reprogrammable built-in-self-test integrated circuit and a test method for the same, wherein the existing application CPU and application CPU program memory are respectively used to perform the bonding-wire connectivity test and store the test program thereof without using additional memory space or an extra built-in-self-test circuit. Thus, the complexity thereof is reduced, and the cost thereof is lowered.

Another objective of the present invention is to provide a reprogrammable built-in-self-test integrated circuit and a test method for the same, wherein test vectors can be flexibly revised to increase test coverage after the tapeout thereof.

Still another objective of the present invention is to provide a reprogrammable built-in-self-test integrated circuit and a test method for the same, wherein the test program stored in the application program memory can be revised after tapeout via an interface to perform failure analysis and diagnosis.

Further another objective of the present invention is to provide a reprogrammable built-in-self-test integrated circuit and a test method for the same, which needn't use additional pins or multiplexing circuits and thus can simplify I/O design.

To achieve the abovementioned objectives, the present invention proposes a reprogrammable built-in-self-test integrated circuit, which comprises: at least one memory chip capable of storing data and a logic chip electrically connected with the memory chip. The logic chip further comprises: a serial transmission interface, at least one application program memory, an application CPU (Central Processing Unit). The serial transmission interface provides an electric connection to an external test apparatus. A test program is loaded into the application program memory via the serial transmission interface. The application CPU is electrically connected with the memory chip and the application program memory. The application CPU reads the test program from the application program memory and executes the test program to test the bonding-wire connectivity between the logic chip and the memory chip.

The present invention also proposes a method for testing a reprogrammable built-in-self-test integrated circuit, which comprises the following steps: a test apparatus resetting the IC to a test mode and transferring the serial data of at least one test program to a serial transmission interface, and the serial transmission interface converting the serial data of the test program into the parallel data of the test program, and storing the parallel data of the test program in an application program memory; the test apparatus resetting the IC to a normal operation mode, and an application CPU reading and executing the test program stored inside the application program memory; the test program generating test vectors to test whether the bonding-wire connectivity between the logic chip and the memory chip is normal; the application CPU generating test data and outputting the test data to the test apparatus for analysis.

Below, the embodiments will be described in detail in cooperation with the attached drawings to make easily understood the objectives, technical contents, characteristics and accomplishments of the present invention.

DETAILED DESCRIPTION OF THE INVENTION

Figure 1:
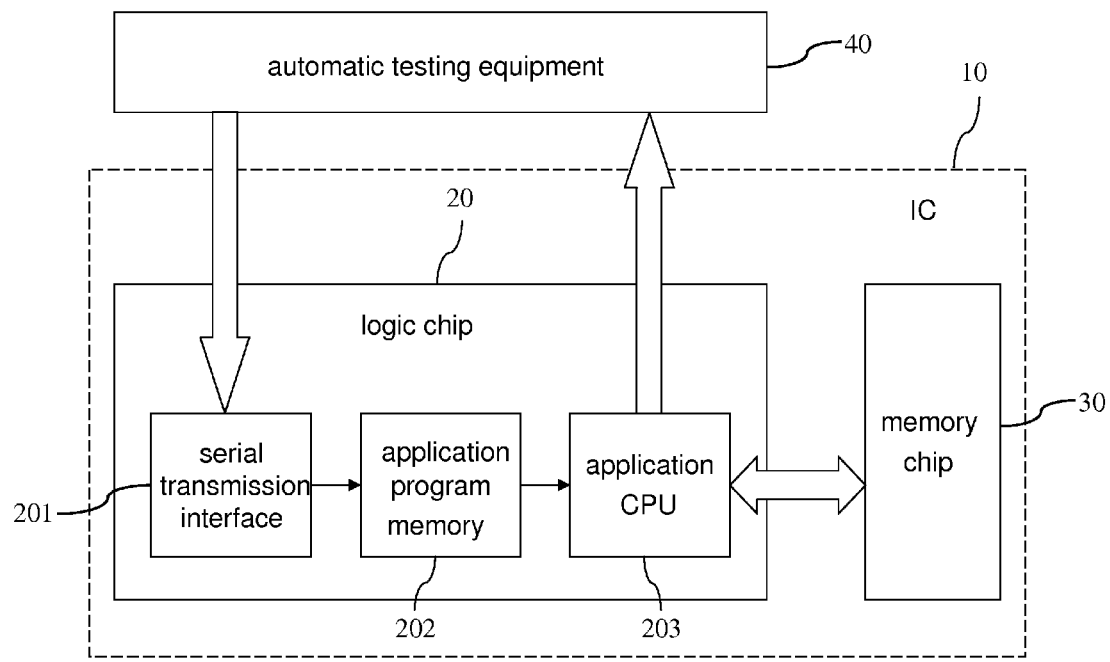
FIG. 1 is a block diagram schematically showing an integrated circuit according to the present invention.

Refer to FIG. 1. The reprogrammable built-in-self-test integrated circuit 10 of the present invention is a multi-chip-package (MCP) system-on-chip (SoC) integrated circuit (IC) and comprises: a logic chip 20 and at least one memory chip 30 electrically connected to the logic chip 20. The memory chip 30 is used to store data and may be a flash memory, a SRAM (Static Random Access Memory), or a SDRAM (Synchronous Dynamic Random Access Memory).

The logic chip 20 is electrically connected to an external automatic testing equipment (ATE) 40. The logic chip 20 further comprises: a serial transmission interface 201, at least one application program memory 202, an application CPU (Central Processing Unit) 203. The serial transmission interface 201 provides an electric connection between the logic chip 20 and the external ATE 40. The serial transmission interface 201 may be a UART (Universal Asynchronous Receiver/Transmitter) interface for signal conversion. The ATE 40 can load a test program to the serial transmission interface 201, and the serial transmission interface 201 performs signal conversion and stores the test program in the application program memory 202. In addition to the test program, the application program memory 202 may also store application programs. The application program memory 202 is a SRAM built in to the logic chip 20. The serial transmission interface 201 supports two modes—a test mode and a normal operation mode. In the test mode, the serial transmission interface 201 receives the serial data of the test program from the ATE 40 and converts the serial data of the test program into the parallel dada of the test program and store the parallel data in the application program memory 202. In the normal operation mode, the serial transmission interface 201 functions as a common transmission interface of the application CPU 203. The application CPU 203 is electrically connected to the application program memory 202 and the memory chip 30. The application CPU 203 reads the test program from the application program memory 202 and performs a bonding-wire connectivity test between the application CPU 203 and the memory chip 30. The application CPU 203 has different actions in different modes. In the normal operation mode, the application CPU 203 reads and executes the application programs stored in the application program memory 202. In the test mode, the application CPU 203 reads and executes the test program stored in the application program memory 202 to perform read tests and write tests on the memory chip 30 and perform comparisons and verifications of test data. Then, the application CPU 203 outputs test data and test results to the ATE 40 via pins for further analysis and comparison.

After the analysis of the test data and test results, if test coverage is found to be insufficient, the ATE 40 can revise the test vectors of the test program stored inside the application program memory 202 via the serial transmission interface 201 to improve test coverage. The ATE 40 can also revise the test program to analyze the defective chips. It is to be noted that the test program is originally stored in the ATE 40, and that the test program will be loaded into the application program memory 202 when a connectivity test is intended to do.

Figure 2:
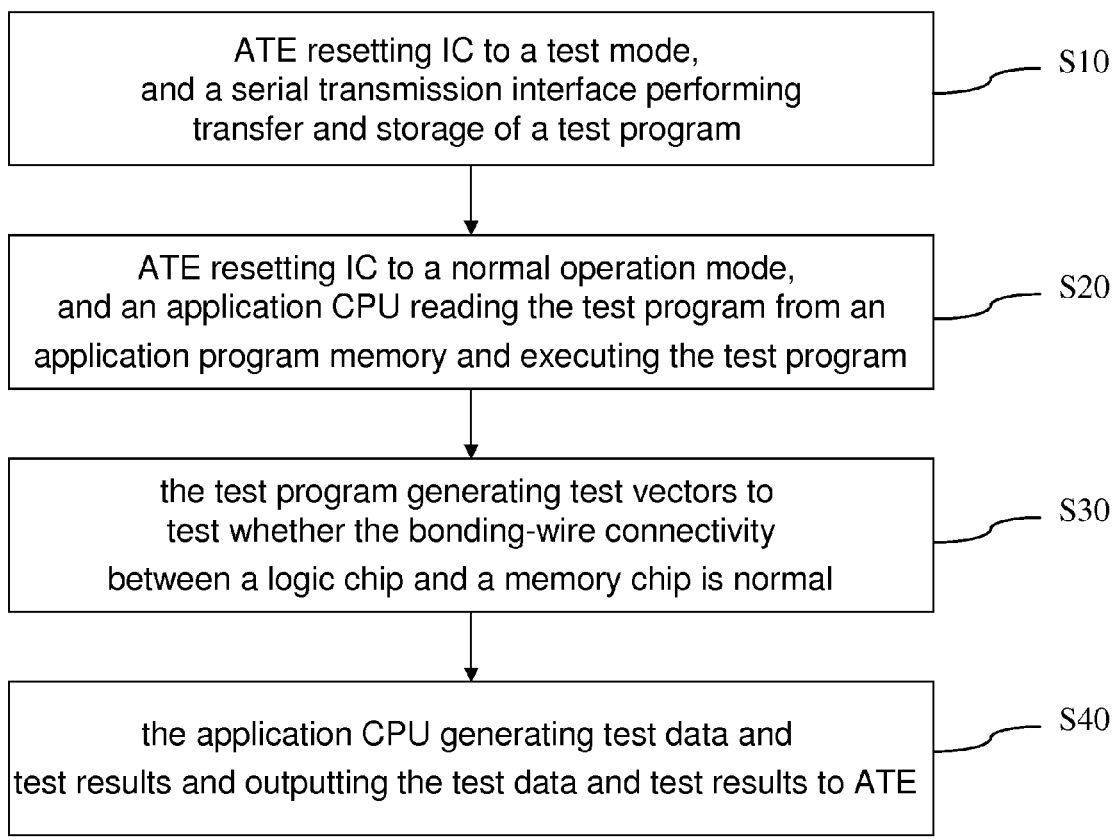
FIG. 2 is a flowchart schematically showing a test method according to the present invention.

After the description of the circuit architecture of the present invention, the test method of the present invention is to be described in cooperation with FIG. 1 and FIG. 2. In Step S10, the ATE 40 sends a reset signal to reset the IC 10 into a test mode and sends serial data of at least one test program to the serial transmission interface 201; the serial transmission interface 201 converts the serial data of the test programs into parallel data of the test programs and stores the parallel data in the application program memory 202. In Step S20, the ATE 40 sends a reset signal again to reset the IC 10 into a normal operation mode, and the application CPU 203 reads and executes the test programs stored in the application program memory 202. (Herein, the test program is a software to test and analyze the bonding-wire connectivity, whereby the memory chip is tested via a series of read and write activities, and test data is then compared and verified.) In Step S30, the application CPU 203 executes the test programs and generates test vectors to test whether the bonding-wire connectivity between the logic chip 20 and the memory chip 30 is normal. In Step S40, test data and test results are acquired, and the application CPU 203 outputs the test data and test results to the ATE 40 via the pins of the logic chip 20 for further comparison and analysis.

In the present invention, the test program can still be flexibly revised after tapeout to modify test vectors and improve test coverage. If test coverage is found to be insufficient, the ATE 40 can revise the test program inside the application program memory 202 via the serial transmission interface 201 to improve test coverage. Besides, the ATE 40 can also revise the test program inside the application program memory 202 via the serial transmission interface 201 to perform failure analysis and diagnosis.

In conclusion, the present invention proposes a reprogrammable built-in-self-test integrated circuit and a test method for the same, which uses the existing application CPU program memory and application CPU to store the test program and perform the bonding-wire connectivity test respectively As the test program is directly stored in the existing application program memory without using additional memory space, and as the test program is executed by the existing application CPU without using an extra built-in-self-test circuit, the present invention can effectively reduce the complexity and cost of IC. Further, the test program can be flexibly revised to modify test vectors and improve test coverage anytime. Furthermore, the present invention needn't use additional pins or multiplexing circuits and thus can simplify I/O design.

The embodiments described above are only to demonstrate the technical thoughts and characteristics of the present invention to enable the persons skilled in the art to understand, make, and use the present invention. However, it is not intended to limit the scope of the present invention. Any equivalent modification or variation according to the spirit of the present invention is to be also included within the scope of the present invention.

What is claimed is:

1. A reprogrammable built-in-self-test integrated circuit comprising:
   at least one memory chip for storing data or program; and
   a logic chip electrically connected to said at least one memory chip:
   the logic chip comprises;

a serial transmission interface providing an electric connection to an external test apparatus;
at least one application program memory storing test programs wherein the test programs being input via said serial transmission interface; and
an application Central Processing Unit (CPU) electrically connected to said at least one memory chip and said application program memory; and
the CPU reading and executing said test programs to perform a test for said memory chip.

2. The reprogrammable built-in-self-test integrated circuit according to claim 1, wherein said memory chip is a flash memory, a Static Random Access Memory (SRAM), or a Synchronous Dynamic Random Access Memory (SDRAM).

3. The reprogrammable built-in-self-test integrated circuit according to claim 1, wherein said serial transmission interface supports two modes including:
a test mode, wherein said serial transmission interface receives test programs from said test apparatus and converts said test programs into parallel data and stores said parallel data in said at least one application program memory; and
a normal operation mode, wherein said serial transmission interface functions as a general transmission interface of said application CPU.

4. The reprogrammable built-in-self-test integrated circuit according to claim 1, wherein said at least one application program memory is a SRAM built into said logic chip and being used to store said test programs or application programs.

5. The reprogrammable built-in-self-test integrated circuit according to claim 4 wherein,
in a normal operation mode, said application CPU reads and executes said application programs stored in said at least one application program memory; and
in a test mode, said application CPU reads and executes said test programs stored in said at least one application program memory to perform write tests, read tests, comparisons and verifications on said memory chip.

6. The reprogrammable built-in-self-test integrated circuit according to claim 1, wherein said test apparatus revises said test programs stored in said at least one application program memory via said serial transmission interface.

7. The reprogrammable built-in-self-test integrated circuit according to claim 1, wherein said test programs are used to test bonding-wire connectivity between said logic chip and said at least one memory chip.

8. The reprogrammable built-in-self-test integrated circuit according to claim 1, wherein said application CPU outputs results of executing said test programs via pins of said logic chip to said test apparatus for further analysis.

9. The reprogrammable built-in-self-test integrated circuit according to claim 1, wherein said logic chip and said at least one memory chip are sub-structures of a multi-chip-package (MCP) system-on-chip (SoC) integrated circuit (IC).

10. The reprogrammable built-in-self-test integrated circuit according to claim 1, wherein said test programs are softwares stored in said test apparatus.

11. A method for testing a reprogrammable built-in-self-test integrated circuit comprising:
providing a logic chip and at least one memory chip;
electrically connecting the at least one memory chip to said logic chip;
providing a serial transmission interface, an application program memory, and an application Central Processing Unit (CPU);
providing a test apparatus to reset said integrated circuit to a test mode and to transfer serial data of at least one test programs to a serial transmission interface;
said serial transmission interface converting said serial data of said at least one test programs into parallel data, and storing said parallel data in said application program memory;
said test apparatus resetting said integrated circuit to a normal operation mode;
said application CPU reading and executing said at least one test programs stored in said application program memory;
said at least one test programs generating test vectors to test bonding-wire connectivity between said logic chip and said at least one memory chip; and
generating test data and test results and outputting said test data and said test results to said test apparatus.

12. The method for testing the reprogrammable built-in-self-test integrated circuit according to claim 11, wherein said outputting said test data and said test results includes said application CPU outputs said test data and said test results via pins of said logic chip to said test apparatus.

13. The method for testing the reprogrammable built-in-self-test integrated circuit according to claim 11, wherein said serial transmission interface supports said test mode and said normal operation mode;
on said test mode, said serial transmission interface receives test programs from said test apparatus; and
said serial transmission interface converts said test programs into parallel data and stores said parallel data in said application program memory;
on said normal operation mode, said serial transmission interface functions as a general transmission interface of said application CPU.

14. The method for testing the reprogrammable built-in-self-test integrated circuit according to claim 11, wherein said application program memory is a SRAM built into the logic chip and being used to store said at least one test programs or application programs.

15. The method for testing the reprogrammable built-in-self-test integrated circuit according to claim 11, wherein after transferring said at least one test programs, said test apparatus revises said at least one test programs having been stored in said application program memory via said serial transmission interface.

16. The method for testing the reprogrammable built-in-self-test integrated circuit according to claim 11, wherein said logic chip and said at least one memory chip are sub-structures of a multi-chip-package (MCP) system-on-chip (SoC) integrated circuit (IC).

17. The method for testing the reprogrammable built-in-self-test integrated circuit according to claim 11, wherein said at least one test programs are softwares stored in said test apparatus.

* * * * *